United States Patent [19]

Shinohara

[11] 4,220,117
[45] Sep. 2, 1980

[54] APPARATUS FOR FABRICATION OF MAGNETIC RECORDING MEDIA

[75] Inventor: Koichi Shinohara, Kobe, Japan

[73] Assignee: Matsushita Electric Industrial Co., Ltd., Osaka, Japan

[21] Appl. No.: 8,083

[22] Filed: Jan. 31, 1979

Related U.S. Application Data

[62] Division of Ser. No. 860,960, Dec. 15, 1977, abandoned.

[30] Foreign Application Priority Data

| Dec. 29, 1976 [JP] | Japan | 51-159591 |
| Jan. 12, 1977 [JP] | Japan | 52-2746 |
| Jun. 22, 1977 [JP] | Japan | 52-74702 |
| Jul. 12, 1977 [JP] | Japan | 52-83851 |
| Jul. 18, 1977 [JP] | Japan | 52-86371 |
| Oct. 5, 1977 [JP] | Japan | 52-120362 |

[51] Int. Cl.² ............... B05C 13/08; B05C 19/02
[52] U.S. Cl. ............... 118/718; 118/50; 427/132
[58] Field of Search ............... 118/718, 50; 427/127-132, 48

[56] References Cited

U.S. PATENT DOCUMENTS 2,925,062 10/1956 Schwindt ............... 118/718

Primary Examiner—Edward C. Kimlin
Assistant Examiner—Alfonso T. Suro Picó
Attorney, Agent, or Firm—Burgess, Ryan and Wayne

[57] ABSTRACT

Within the vacuum atmosphere containing oxygen a cylindrical rotary can and an evaporation source are disposed in opposed relationship and in such a way that the normal line constructed at the center of the evaporation surface of the evaporation source will not intersect the axis of the cylindrical rotary drum. The beam of the evaporating ferromagnetic substance is directed to and impinged against the substrate transported along the rotary drum at right angles to the direction of transport thereof.

2 Claims, 11 Drawing Figures

FIG. 11

APPARATUS FOR FABRICATION OF MAGNETIC RECORDING MEDIA

This is a division of application Ser. No. 860,960, filed Dec. 15, 1977, now abandoned.

BACKGROUND OF THE INVENTION

The present invention relates to a method and apparatus best adapted for the fabrication of magnetic recording tapes wherein the substrate comprises a high molecular compound and more particularly, to a method and apparatus for depositing a ferromagnetic thin film of such a thickness that an increased coercive force as well as desired remanence may be obtained.

Figure 1:
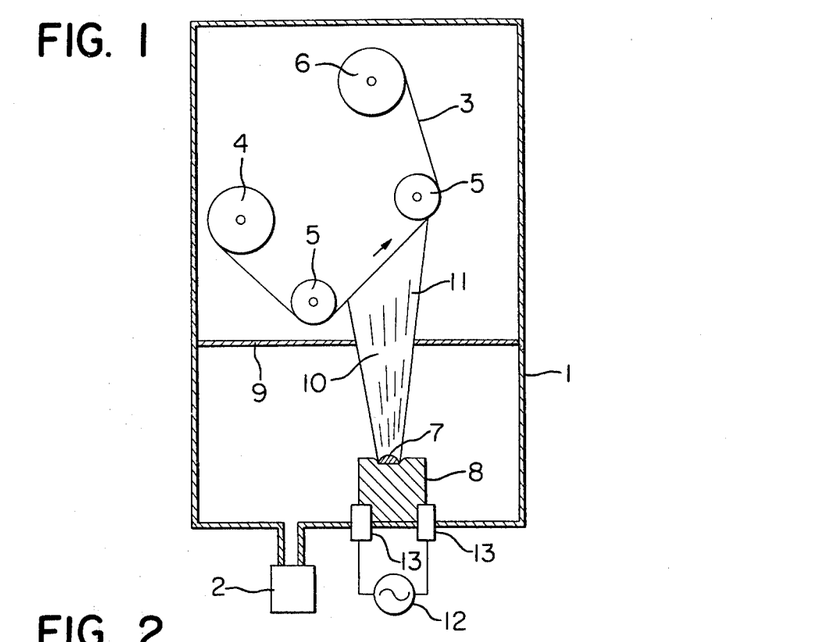
FIG. 1 is a vertical sectional view of a prior art apparatus for vacuum depositing a thin ferromagnetic film on a substrate.

Instead of the coated type magnetic tapes wherein needleshaped ferromagnetic crystals of gamma-$Fe_2O_3$, which is most typical, are mined with a suitable binder and coated on a substrate, the methods and apparatus for forming ferromagnetic thin films by plating or vacuum deposition or evaporation have been developed in order to increase the density of signals recorded on the magnetic recording tapes. The studies have been continued for a long time, and some data suggesting the feasibility of the fabrication of magnetic recording tapes by vacuum evaporation have been reported. The main reason why vacuum evaporation is not employed in practice in the fabrication of magnetic recording tapes having high coercive force is that the thin film formation rate is very slow. Thin ferromagnetic films may be formed by the so-called inclined vacuum evaporation process disclosed in U.S. Pat. No. 3,342,632 and shown in FIG. 1. However, with a thin substrate less than 20 microns in thickness and consisting of a high molecular compound, the thin film formation rate is extremely slow because of the reasons described below. Referring to FIG. 1, the thickness for polyethyleneterephthalate film, which is widely used as a substrate of magnetic recording tapes, by this transport system is limited approximately to 200 Å when Fe is deposited thereon because of the adverse thermal deterioration of the substrate due to the radiant heat from an evaporation source, the latent heat of evaporated ferromagnetic substance, etc. In order to obtain a remanence sufficient for audio magnetic recording and reproduction, the thin ferromagnetic film deposition steps must be cycled ten to 15 times. Repeated deposition results in drop-out and noise which adversely affect audio magnetic recording and reproduction.

SUMMARY OF THE INVENTION

In view of the above, the present invention has for its object to provide a method and apparatus for the fabrication of magnetic recording tapes which have high coercive forces and are very satisfactory in performance in audio magnetic recording and reproduction.

Briefly stated, the present invention provides a method for fabrication of magnetic recording tapes wherein, within the vacuum atmosphere containing oxygen and argon, a cylindrical rotary drum and an evaporation source are disposed in opposed relationship and in such a way that the normal line erected at the center of the evaporation surface of the evaporation source will not intersect the axis of the cylindrical rotary drum, and the beam of evaporating ferromagnetic substance is directed to and impinged against a substrate, which is made of high molecular compound and transported along the cylindrical rotary drum, at right angles to the direction of transport of the substrate, thereby forming a ferromagnetic thin film. Furthermore, the present invention provides an apparatus for fabrication of magnetic tapes wherein a vacuum vessel or chamber is divided into three spaces which are substantially closed to each other and arrayed in a column; that is, vertically; a mechanism for unwinding a flexible substrate, a mechanism for winding the substrate and a plurality of electric discharge treatment devices which are disposed within the upper space; two pairs each consisting of a cylindrical rotary drum which is reversible in rotation and an evaporation source disposed in opposed relationship in the intermediate space; a pair of a cylindrical rotary drum and an evaporation source in opposed relationship to the rotary drum which is disposed within the lower space; and independent gas introduction systems which are connected to the upper, intermediate and lower spaces, respectively.

DESCRIPTION OF THE PREFERRED EMBODIMENTS

Prior Art, FIG. 1

A prior art method for fabrication of magnetic films will be described briefly. A Ball jar 1 is evacuated by an evacuation system 2 to $10^{-5}$ to $10^{-6}$ torr, and a substrate 3 is transported from a supply roll 4 through metal rolls 5 to a make-up roll 6 in the direction indicated by an arrow. An evaporation source 7 consisting of a ferromagnetic substance is evaporated by the Joule heat produced by a heater 8 connected through insulated terminals 13 to a power source 12, and the beam 11 of evaporating metal which is controlled by an aperture 10 in a mask or shield 9 is impinged against the substrate 3 at an inclined angle. The "inclined evaporation" refers to a method wherein the angle between a normal line erected on the substrate 3 and the incident beam of evaporating metal is greater than 30°, but this definition is not clear because sometimes the evaporation methods wherein the beam of evaporating metal is incident to the substrate at any angle other than 90° are also referred to as "inclined evaporation methods". However, it has been well known in the art that the desired improvement in coercive forces of ferromagnetic thin films may be attained when the angle of vapor incidence is greater than 30°.

The present invention provides a method and device for the fabrication of magnetic tapes which are very satisfactory for audio recording and reproduction and have high coercive forces, with the beam of evaporating metal incident to the substrate at an angle greater than 30°. The present invention will be described in conjunction with the deposition of a ferromagnetic substance, but it will be understood that in case of the fabrication of magnetic films with a multilayer construction, the present invention is not limited by the methods for forming layers other than the ferromagnetic thin film and the present may be used in combination with the prior art methods for the fabrication of multilayer magnetic tapes.

First Embodiment, FIGS. 2, 3, 4 and 5

Figure 2:
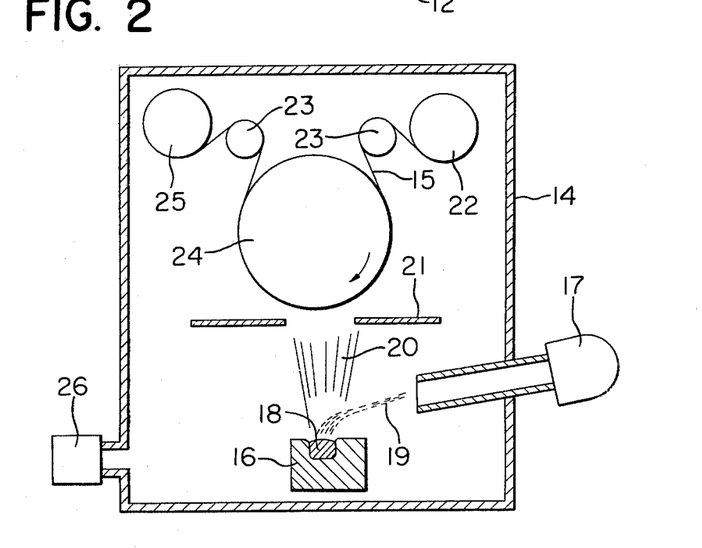
FIG. 2 is a schematic vertical sectional view of a first embodiment of the present invention.

Within a vacuum chamber 14, a substrate 15 comprising a high molecular compound or a plastic film is transported from a supply roll 22 through metal rolls 23 to a take-up roll 22 in such a way that the substrate 15 may be brought into very intimate contact with the periphery of a cylindrical rotary drum 24 which is suitably heated or cooled to a desired temperature by a heating medium or a coolant circulating through the rotary drum 24. Disposed in opposed relationship with the deposition area of the rotary drum 24 is an evaporation source 18 of a ferromagnetic material and a source of a vapor of Co, Fe, Ni, etc. consisting of a water-cooled copper hearth 16, an electron gun 17 and a deflection and a scanning system (both not shown). The hearth 16 is so disposed that the major axis of its evaporation surface is perpendicular to the direction of the transport of the substrate 15. The electron gun 17 produces the electron beam 19 which bombards the evaporation source 18 to heat and evaporate it, thereby forming the beam 20 of evaporating metals. The incidence of the beam 20 of evaporating metals to the substrate 15 on the rotary drum 24 is controlled by a mask or shield 21. The vacuum vessel 14 is evacuated to $10^{-5}$ to $10^{-6}$ torr by an evacuation system 26, and if necessary, a suitable atmosphere gas such as oxygen is introduced into the vacuum chamber 14.

EXAMPLE:

The rotary drum 24 with a diameter of 50 cm and a width of 50 cm was used. The minor axis of the evaporation surface was 3 cm while the major axis was 40 cm, and the substrate-to-source distance was 30 cm. The vacuum chamber 14 was evacuated to $5 \times 10^{-5}$ torr, and the evaporation source or Co was heated and evaporated by the electron gun 17 of 50 KW so that a magnetic thin film 1200 Å was formed on the substrate 15 or polyester film 40 cm in width. (The polyester film substrate had been previously coated with an aluminum thin film 500 Å in thickness.) The coated film was then cut into magnetic tapes 3.8 mm in width, and a signal of 1 KHz was recorded on the magnetic tape and reproduced. As compared with the conventional magnetic tapes having the corresponding ferromagnetic thin-film, the output in reproduction was improved by 4 to 6 db. This magnetic property is very effective for improving the recording density per volume unit that is, for the fabrication of long-recording-time magnetic tapes. This very favorable magnetic property is obtained by the sharp distribution of coercive forces which in turn is attained by the mask 21 which controls the beam of vapor incident to the substrate 15 at an angle greater than 22°.

Figure 3:
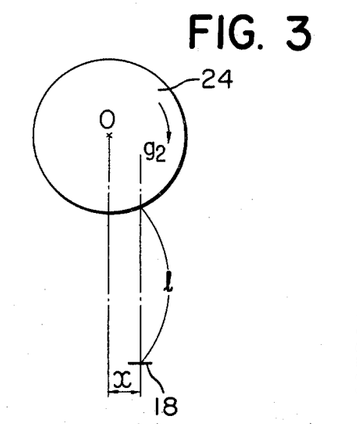
FIGS. 3 and 4 are views used for the explanation thereof.

Another important feature of the present invention resides in the fact that the normal line constructed at the center of the evaporation surface does not intersect the axis O of the rotary drum 24 as shown in FIG. 3. This feature completely differentiates the present invention from the prior art methods wherein the evaporation source is disposed immediately below the rotary drum. The effects obtained by this arrangement will be described in detail hereinafter. The arrangement, configurations, etc. of the rotary drum and the evaporation source vary depending upon the magnetic tapes of desired properties. When the substrate is made of a high molecular compound, the substrate-to-evaporation source distance l (See FIG. 3) is made as short as possible while being at a sufficient distance so that the deterioration of the substrate due to the radiant heat from the evaporation source 18 may be avoided, and the distance x (between the vertical line passing the axis of the rotary drum 24 and the normal line constructed at the center of the evaporation source 18 is deviated toward the supply roll 22) is made as long as possible. Then, the most desirable effects may be attained.

Figure 4:
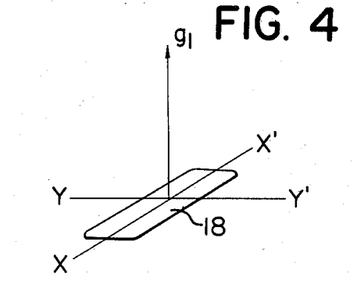

In general, the evaporation surface is not flat so that in this specification, the term "evaporation surface" refers to a projection on a plane as shown in FIG. 4 and a vertical line $g_1$ is constructed at the center.

Figure 5:
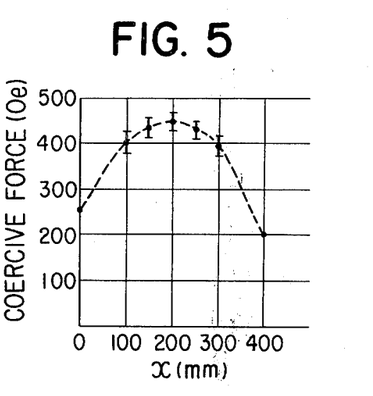
FIG. 5 is a graph illustrating the relationship between the coercive force Oe and and the distance x shown in FIG. 3.

FIG. 5 shows one example of effects attained by the first embodiment; that is, the relationship between the coercive force Oe and the distance x when the distance l (See FIG. 3) is 250 mm. It is seen that the coercive force is almost doubled as compared with the prior art methods that is, the coercive force with the distance x being zero. Thus, the present invention satisfies one of the most important conditions required for the fabrication of magnetic tapes capable of recording at an extremely high density.

The evaporation source used in the present invention includes Co, Fe, Ni and alloys thereof with suitable additional elements. The magnetic recording media fabricated in accordance with the present invention exhibits high coercive forces and excellent square hysteresis ratios and may be mass produced. Thus, the present invention is very useful.

A further important feature of the present invention resides in the fact that a leak wave (not shown) is suitably adjusted and gas inlet ports (not shown) are suitably located so that suitable streams of gas may be formed in the vicinity of the portion of the substrate on which the ferromagnetic thin film is deposited. The gas is preferably oxygen or $O_2 + Ar$ or $O_2 + H_2$ as is obvious to those skilled in the art, but it will be understood that the forced introduction of oxygen into a vacuum chamber is also within the scope of the present invention. The configurations, dimensions and positions of the gas inlet ports are so determined that the streams of oxygen may be formed in the vicinity of the substrate in an equilibrium state. The factors influencing the design of the gas inlet ports are therefore the width of the substrate, the diameter of the rotary drum, the substrate-to-source distance, the positions of the gas inlet ports relative to the evacuation system, the capacity of the evacuation system, etc.

EXAMPLE

A rotary drum with a diameter of 300 mm, a substrate with a width of 150 mm and an electron beam gun of 12 KW were used. The minimum distance between the substrate and the evaporation source was held to 250 mm; the minimum distance between the substrate and the gas inlet port, 5 mm; and the minimum distance between the evaporation source and the gas inlet port, 275 mm. A vacuum chamber with a volume of 100 liters was used. The distance from the center of the exhaust port to the evaporation source was 400 mm, and the distance from the center of the exhaust port to the gas inlet port was 600 mm. The evaporation source was Co (98%) and Ni (2%) or Co (95%) and V (5%). The substrate was a polyethyleneterephthalate film 15 microns in thickness and coated with copper 300 A in thickness by vacuum evaporation at $1 \times 10^{-5}$ torr.

A comparison of the magnetic properties of the magnetic tapes fabricated in accordance with the present invention with magnetic tapes fabricated by the prior art methods is shown in TABLE I.

TABLE I

| | Manufacturing condition | | Magnetic property | | Output of tape | Resistance to corrosion |
| | Magnetic material | Introduction of oxygen | Shifting speed of substrate | Coercive force | Square hysteresis ratio | Speed 4.75 cm/s OdB commodity C-120 | Rust after 100 hrs |
|---|---|---|---|---|---|---|---|
| PRESENT INVENTION | $C_o$98% Ni2% | NO$_3$ 0.05l/min | 12m/min | 340 Oe | 0.91 | + 1-2 dB | Nothing |
| | " | NO$_3$ 0.09l/min | " | 385 Oe | 0.92 | + 2-3 dB | " |
| | " | NO$_3$ 0.12l/min | " | 420 Oe | 0.90 | + 2-4 dB | " |
| | $C_o$95% V5% | NO$_3$ 0.05l/min | " | 480 Oe | 0.88 | + 1-3 dB | " |
| | " | NO$_3$ 0.09l/min Ar0.09/min | " | 495 Oe | 0.86 | + 2 dB | " |
| PRIOR ART | $C_o$98% Ni2% | Nothing | " | 60 Oe | 0.5 | − 15 dB | Spot-like rust of 2-3/cm$^2$ |
| | " | 0.2l/min from leak valve | " | 68 Oe | 0.6 | − 18 dB | Spot-like rust of 0.5/cm$^2$ |
| | $C_o$95% V5% | 0.2l/min from leak valve | " | 45 Oe | 0.55 | − 19 dB | Spot-like rust of 0.1-0.5/cm$^2$ |

From TABLE I, it is seen that the magnetic properites, the outputs and the resistance to corrosion of the magnetic tapes fabricated in accordance with the present invention are by far superior to those of the magnetic tapes fabricated by the prior art methods.

Instead of the electron beam bombardment, resistance or induction heating may be employed. And, as described elsewhere, a hollow cylindrical rotary may be used so that the heating medium or the coolant may be circulated through the rotary drum to control the temperature thereof, whereby the stable control of the coercive force and remanence may be attained.

Figure 6:
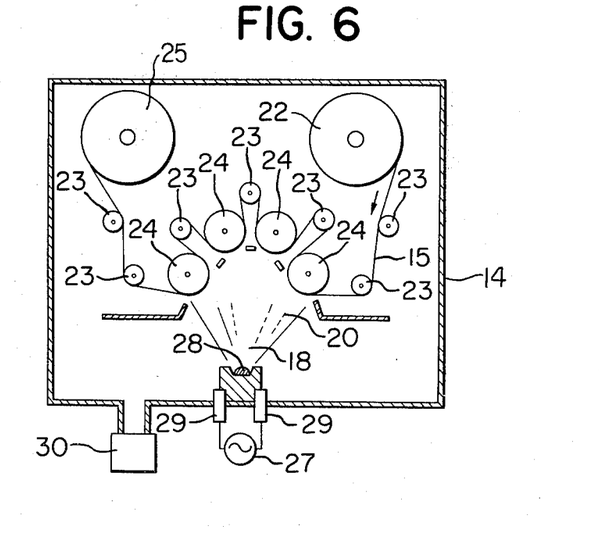
FIG. 6 is a schematic vertical sectional view of a second embodiment of the present invention.

Second Embodiment, FIG. 6

The objects of the present invention may be also attained by the second embodiment wherein the substrate 15 passes a plurality of cylindrical rotary cans 24. Since each of the rotary cans 24 is temperature controlled independently of the others, the ferromagnetic thin films may be formed at the same temperature. It is very important to maintain the substrate 15 at the same temperature so that the magnetic tapes may have the same magnetic properties. In FIG. 6, reference numeral 27 denotes a power source; 28, a heater; 29, insulated terminals; 30, an evacuation system; and 31, a mask.

Figure 7:
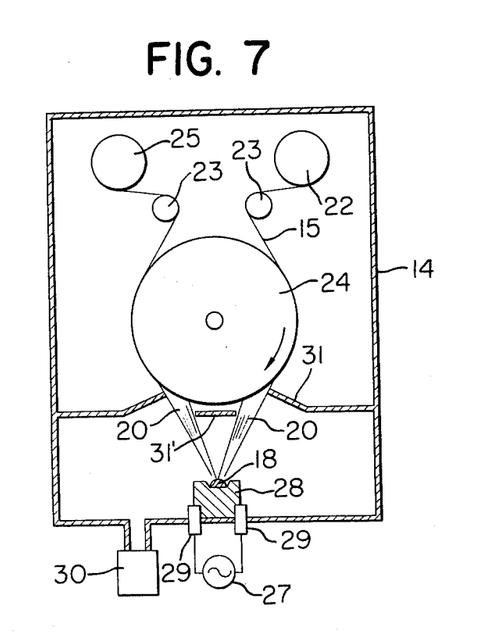
FIG. 7 is a schematic sectional view of a third embodiment of the present invention.

Third Embodiment, FIG. 7

The third embodiment shown in FIG. 7 is substantially similar in construction to the first embodiment shown in FIG. 2 except that an additional mask 31' is provided so that the beam of the evaporating ferromagnetic substance from the source 17 is branched into two beams which impinge against the substrate 15 on the rotary can 24 to form the ferromagnetic thin film.

The evaporation source may be heated and evaporated by any suitable conventional method such as the bombardment of electron beam depending upon the desired magnetic properties.

If necessary, a reaction gas may be introduced.

Instead of branching the beam of evaporating metal into two, it may be branched into a plurality of beams, but it is preferable to split the beam of evaporating ferromagnetic substance as shown in FIG. 7 because the magnetic properties of the ferromagnetic thin films thus deposited may be improved.

Furthermore, a plurality of rotary cane may be provided so that the deposition efficiency (the ratio of the quantity of ferromagnetic substance deposited on the substrate to the quantity of evaporated ferromagnetic substance) may be increased as will be described in detail hereinafter with reference to FIG. 8.

Figure 8:
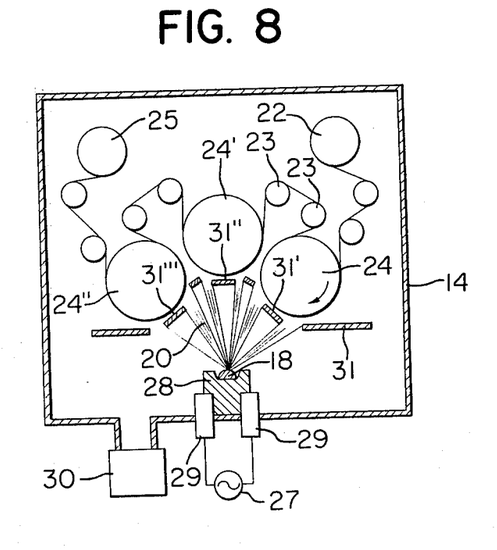
FIG. 8 is a schematic vertical sectional view of a fourth embodiment of the present invention.

Fourth Embodiment, FIG. 8

In the fourth embodiment shown in FIG. 8, the substrate 15 passes through a plurality of rotary drum 24, 24' and 24" and is exposed to the beams of an evaporating ferromagnetic substance which has been split by the masks 31', 31" and 31'". The rotary drums 24, 24' and 24" are temperature controlled independently of each other in the manner described above. Thus, the magnetic properties of the ferromagnetic thin films may be further improved and stabilized. For instance, the temperatures of the rotary drum 24, 24' and 24" are stabilised at −10° C., −15° C. and −25° C., respectively, so that the temperature increase of the substrate 15 may be avoided. Thus, the ferromagnetic substance may be deposited at the same temperature so that the uniform distribution of coercive forces may be ensured and the square hysteresis ratio may be improved.

The configurations and dimensions of the masks 31', 31" and 31''' may be selected as required.

EXAMPLE

A vacuum evaporation device of the type shown in FIG. 7 was used. The diameter of the rotary drum 24 was 500 mm, and the mask 31' was 70 mm in width. Co was heated and evaporated by resistance heating at 15 KW in a vacuum chamber evacuated to $5 \times 10^{-5}$ torr. and deposited on the polyethyleneterephthalate film to a thickness of 1500 Å. The square hysteresis ratio was 0.87; the coercive force, 390 Oe; and the saturated flux density was 17000 gauss.

The deposition efficiency is about 30% with the device shown in FIG. 7 and about 40% with the device shown in FIG. 8. The deposition efficiency of the present invention is more than 10 times the deposition efficiency attainable by the prior art methods. Therefore, the method and device of the present invention may be technically feasible in actual production.

As described elsewhere, the vacuum evaporation method and device in accordance with the present invention for forming the ferromagnetic thin films are compatible with other vacuum evaporation methods and devices for forming multilayer magnetic films. To this end, a plurality of different evaporation sources may be disposed in opposed relationship with the rotary can. Alternatively, pairs of a rotary can and an evaporation source may be arranged. The present invention discloses also an apparatus best adapted to fabricate the magnetic tapes with a uniform distribution of multilayers.

Figure 9:
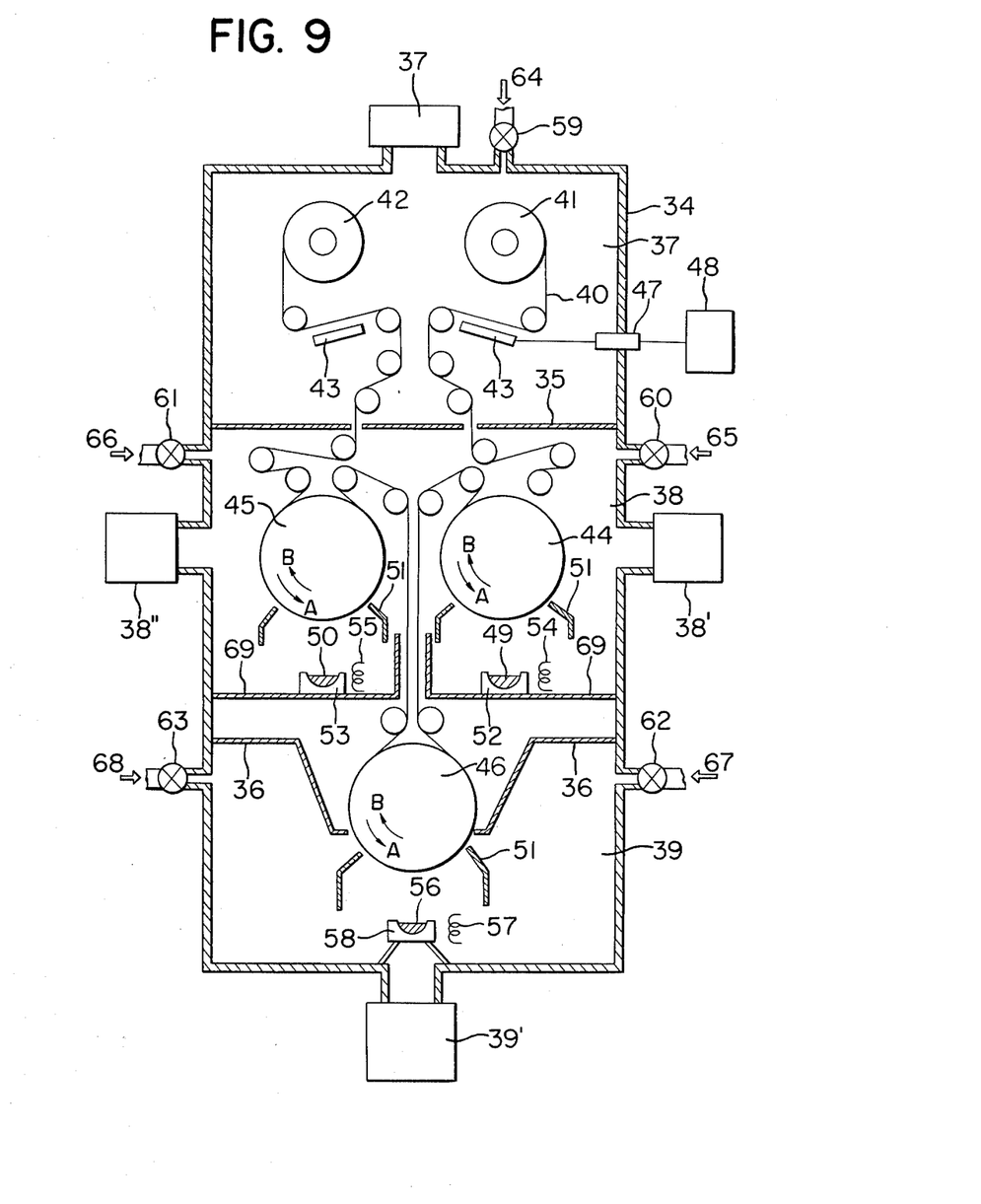
FIG. 9 is a schematic vertical sectional view of a fifth embodiment of the present invention.

Fifth Embodiment, FIG. 9

Referring to FIG. 9, a vacuum chamber 34 is divided by partition walls 35 and 36 into three spaces 37, 38 and 39 which are substantially independent from each other and are evacuated to desired degrees of vacuum by independent evacuation systems 37', 38' and 39'. The arrangements of these evacuation systems are very closely related with the gas introduction systems described below. The upper space 37 must be evacuated from the top; the intermediate space 38 must be evacuated symmetrically about the vertical; and the lower space 39 must be evacuated from the bottom. The construction and capacity of the evacuation systems are of course determined depending upon the volume and material of the vacuum vessel 34, and will not limit the scope of the present invention.

Disposed within the upper space 37 are the substrate supply and take-up rolls 41 and 42 and an electric discharge treatment device 43. The supply and take-up rolls 41 and 42 are reversed as rotary cans 44, 45 and 46 are reversed in either the direction A or B. If device is required for transporting in a zig-zag manner, a thin and wide substrate may be provided. But this not limit the scope of the present invention. The discharge treatment device 43 is connected through an insulated terminal 47 to a power source 48 which may be AC or DC. It is preferable to use an AC or RF glow. Furthermore, instead of introducing only argon gas into the upper space 37 as in the prior art, it is preferable to introduce a gas containing oxygen because the bonding strength between the thin film and the substrate may be considerably improved.

The space in the vicinity of the discharge treatment device 43 may be partially closed, and a gas may be introduced into this space. This arrangement is not beyond the division of a space in accordance with the present invention and is included in the discharge device.

Disposed within the intermediate space 38 are cylindrical rotary cans 44 and 45 which are reversible in the direction A or B and evaporation sources 49 and 50 (of course more than two sources may be provided) in opposed relationship with the rotary cans 44 and 45, respectively. 51 is a mask, and 69 is a support of the evaporation source.

The evaporation sources are schematically shown as being of the electron beam type, but it will be understood that they may be of any suitable conventional types. 52 and 53 are water-cooled copper hearths, and 54 and 55 show schematically electron beam guns.

Disposed within the lower space 39 are a cylindrical rotary can 46 and an evaporation source 56 in opposed relationship with the rotary can 46. The evaporation source consists of an electron beam gun 57 and a water-cooled hearth made of copper for heating and evaporating the evaporation source 56.

A gas introduction system consists of a drier, a reservoir and a pressure regulator all of which are not shown but are of the conventional types. The important thing in this invention is the gas flow which is dependent upon the gs inlet port and the exhaust port. Desired gases 64, 65, 66, 67 and 68 are introduced into the vacuum chamber or the upper, intermediate and lower spaces 37, 38 and 39 through needle valves 59, 60, 61, 62 and 63.

The positional relationship between the gas inlet port and the exhaust port of the upper space 37 will not affect decisively the fundamental properties of the thin films fabricated by the apparatus shown in FIG. 9, but the positional relationships between them in the intermediate and lower spaces 38 and 39 are very important. When the substrate is reversed in direction when a multilayer thin film is deposited thereupon, the symmetry is very important. From the EXAMPLE to be described below, one will be at once aware of the important fact that the exhaust port is located below while the inlet port, above.

EXAMPLE

With the device of the type shown in FIG. 2, a Cr thin film of the thickness of 350 Å and a Fe thin film of the thickness of 500 Å were alternately deposited on a substrate or a polyethyleneterephthalate film 15 microns in thickness to form a magnetic recording medium or a magnetic tape 1700 Å in total thickness. Cellotapes were used to test the adhesion strength of the thin film, and the result was that the weight after test varies between 50 and 20%. The variation in output (sensitivity) in reproduction in the lengthwise direction was ±3 dB. The above was the results when the magnetic tape was tested over the total length of 2500 meters.

With the apparatus of the type shown in FIG. 9, the magnetic recording medium or the magnetic tape having the same specifications as described above was fabricated under the following conditions:

I.

(1) O₂ is introduced through the needle valve 59 at the rate of 0.2 liters per minute while Ar, at the rate of 0.2 liters per minute.

(2) Discharge Treatment:
   RF, 50 KHz, output 250 W
   Anode voltage: 1.2 KV (3) Can Temperature 0° C.

(4) When the substrate is transported in the direction B, O₂ is continuously introduced at the rate of 0.1 liter per minute through the needle valve 61 while Ar, at the rate of 0.03 liter per minute.

A valve (not shown) in the evacuation or exhaust system 38" is closed.

The evaporation source 49 is energized to form a Cr thin film on the substrate 40.

Thereafter, O₂ is continuously introduced through the needle valve 62 at the rate of 0.05 liters per minute.

The evaporation source 56 is energized to deposit an Fe thin film on the Cr thin film.

When the substrate is transported in the direction A, O₂ and Ar are continuously introduced through the needle valve at the rates of 0.1 liter per minute and 0.03 liters per minute. The valve in the evacuation or exhaust system 38" is closed. The evaporation source 50 is energized to deposit a Cr thin film on the Fe thin film.

O₂ is introduced through the needle valve 63 continuously at the rate of 0.05 liters per minute.

The evaporation source 56 is energized to form an Fe thin film over the Cr thin film.

The above steps were repeated to alternately form Cr and Fe thin films on the substrate 40.

II

Instead of (4) of I, that is Fe, Co (50%) and Fe (50%) were used.

III

The procedure II was followed, but in case of the deposition of Fe, (4) of I, O₂ was continuously introduced at the rate of 0.1 liters per minute through the needle valve 63 when the substrate was transported in the direction B, and O₂ was continuously introduced at the rate of 0.1 liters per minute through the needle valve 62 when the substrate was transported in the direction A.

IV

In addition to I, the discharge treatment was effected and the gas was introduced into the upper space.

Cellotape tests were made to determine the bonding strength of the ferromagnetic thin film to the substrate. IV resulted in the worst ranging from 70 to 50%, but under the conditions of I, II and III, the results were between 100 and 90%.

The variations in output in reproduction were measured over the whole length of 3600 meters. All of the tapes fabricated under the conditions I through IV showed variations of less than 1 dB. The measurements were made with the signal with a wavelength of 4 microns.

These results are comparable with those of the coated type magnetic tapes available in the market. Thus, the apparatus shown in FIG. 9 is advantageous in the fabrication of multilayer thin film magnetic tapes having a uniform distribution of magnetic properties in the lengthwise direction.

Figure 10:
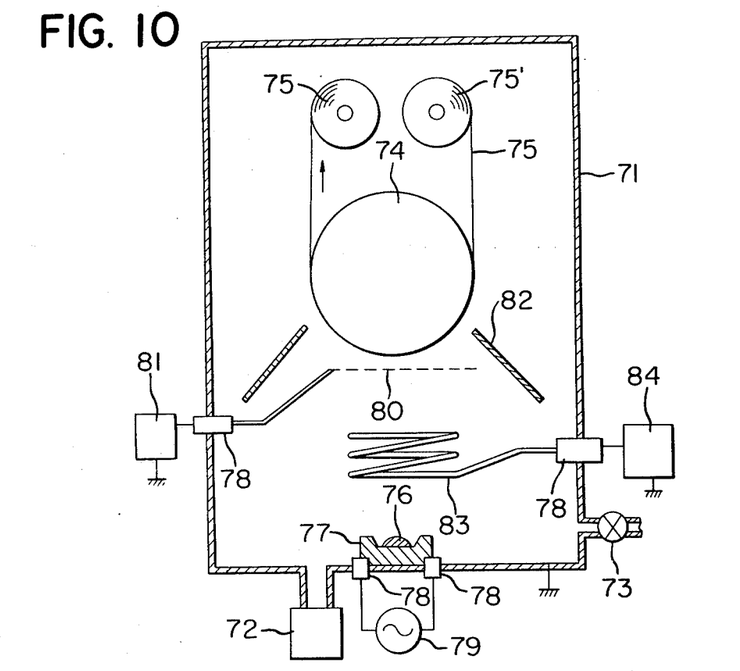
FIG. 10 is a schematic, vertical sectional view of a sixth embodiment of the present invention.

Sixth Embodiment, FIG. 10

The apparatus shown in FIG. 10 is adapted to increase the bonding strength of the thin film to the substrate. A vacuum chamber 71 is evacuated to a desired degree of vacuum by an evacuation system 72, and oxygen is introduced through a variable leak valve 73 to a desired partial pressure. A cylindrical can 74 around which passes a substrate 72 and an evaporation source of a ferromagnetic substance 76 is disposed in opposed relationship. In this embodiment, the evaporation source is of the resistance heating type consisting of a boat 77, insulated terminals 78 and a power source 79, but it will be understood that any conventional heating systems such as the electron beam bombardment, the induction heating etc. may be of course employed.

A screen type electrode 80 is interposed between the substrate 75 and the evaporation source. The configuration and position of this electrode 80 are matters of choice in design to those skilled in the art and will not limit the scope of the present invention. Even without the use of the screen type electrode 80, the effects of the present invention may be equally obtained. The electrode 80 is connected through an insulated terminal 78 to a power source 81 and is maintained at a predetermined voltage. Masks 82 are disposed in order to control the impingement against the substrate of the beam of evaporating ferromagnetic substance. A discharge electrode 83 is connected through an insulated terminal to a high-frequency power source 84. The substrate 75 is transported from a supply roll 75' to a take-up roll 75".

According to the sixth embodiment, part of the beam of evaporating ferromagnetic substance is ionized. In FIG. 10 the ionization is effected by the high-frequency glow discharge, but any suitable discharges such as a hot-cathode discharge which may be maintained in vacuum of the order of $10^{-4}$ torr may be used. The fundamental effects obtained are the same.

In the present invention, the term substrate refers also to a substrate made of a high molecular compound and coated with a non-ferromagnetic thin film deposited by vacuum evaporation. When the magnetic tapes with alternate nonferromagnetic thin films and ferromagnetic thin films are fabricated, the apparatus must be designed and constructed accordingly. The ferromagnetic thin films are formed in accordance with the present invention, and the apparatus including the step for forming the ferromagnetic thin films in accordance with the present invention is therefore within the scope of the present invention.

The substrate 75 is made to pass around the cylindrical can 74, and it is one of the important conditions that the partial pressure of oxygen be maintained below $8 \times 10^{-4}$ torr as will be seen from FIG. 11. (The optimum range is between $8 \times 10^{-4}$ and $2 \times 10^{-5}$, and the stability of discharge cannot be ensured at a pressure lower than $2 \times 10^{-5}$ torr.) Only when the above conditions are satisfied, the excellent magnetic recording media capable of recording signals at a high density may be provided.

EXAMPLE

A can with the diameter of 300 mm and an electron beam gun of 12 KW were used to heat and evaporate a ferromagnetic substance consisting of Co (90%) and Ni (10%). The minimum substrate-to-source distance was maintained at 28 cm. Thin films 1200 to 1400 Å were formed. The DC magnetization characteristics in lengthwise direction or the relationship between the coercive force and the partial pressure of oxygen are shown in FIG. 11.

The substrates were polyethyleneterephthalate film 15 microns in thickness and polyamide films ten microns in thickness (sold under the trade name of "Buron"). Both films were coated with a Ti thin film 350 Å in thickness by vacuum evaporation.

It has been confirmed that in order to obtain a high coercive force and a high square hysteresis ratio, ferromagnetic substances such as Co (100%), Fe, Ni and their alloys with suitable elements must be heated and evaporated at their respective optimum oxygen partial pressure ranges.

A glow discharge was effected at 13.56 MHz and 300 W, and the screen type electrode was grounded. The magnetic characteristics similar to those shown in FIG. 1 may be attained without the use of glow discharge which positively ionizes the beam of evaporating the ferromagnetic substance. That is, the vapor of evaporating ferromagnetic substance which is partially ionized as the substance is evaporated is made to pass through the screen type electrode which is maintained at 100 to 3000 DC V. This arrangement is also within the scope of the present invention. Thus, the present invention is very useful irrespective of whether the glow discharge is utilized or not.

As described above, within the vacuum atmosphere containing oxygen, the beam of evaporating ferromagnetic substance from the evaporation source which deviates from the vertical line passing the axis of the cylindrical rotary can is impinged against the substrate perpendicular to the direction of transport thereof along the cylindrical rotary can, whereby the ferromagnetic thin film is formed. Therefore, the deposition is started with the vapor beam inclined toward the supply roll, then with the vapor beam incident perpendicular to the substrate and finally the vapor beam inclined toward the take-up roll and including the vapor components flowing in the direction of the substrate transport. Thus, ferromagnetic thin films having a high coercive force may be formed and therefore the magnetic recording tapes with improved magnetic properties in the lengthwise direction and capable of recording the signals at a high density may be fabricated in a simple manner. Therefore, the present invention is very useful in industry.

What is claimed is:

1. A vacuum thin film deposition apparatus comprising a vacuum vessel or chamber divided into upper, intermediate and lower spaces which are substantially close to each other; said spaces being arrayed in a vertical column; each of said spaces being connected to independent evacuation systems; a mechanism for unwinding a flexible substrate, a mechanism for winding said flexible substrate and a plurality of discharge treatment devices which are disposed in the upper space; two pairs of a cylindrical rotary drum which are reversible in rotation and an evaporation source which are disposed in the intermediate space in opposed relationship; one pair of a cylindrical rotary can which is reversible in rotation and an evaporation source which are disposed in the lower space; and independent gas introduction systems which are connected to said upper, intermediate and lower spaces.

2. A vacuum thin film deposition apparatus according to claim 1 wherein the evacuation system is connected to the top of the upper space; the evacuation system is connected to both lateral sides of the intermediate space; and the evacuation system is connected to the bottom of said lower space.

* * * * *

UNITED STATES PATENT AND TRADEMARK OFFICE
CERTIFICATE OF CORRECTION

PATENT NO. : 4,220,117
DATED : September 2, 1980
INVENTOR(S) : Koichi Shinohara

Figure 11:
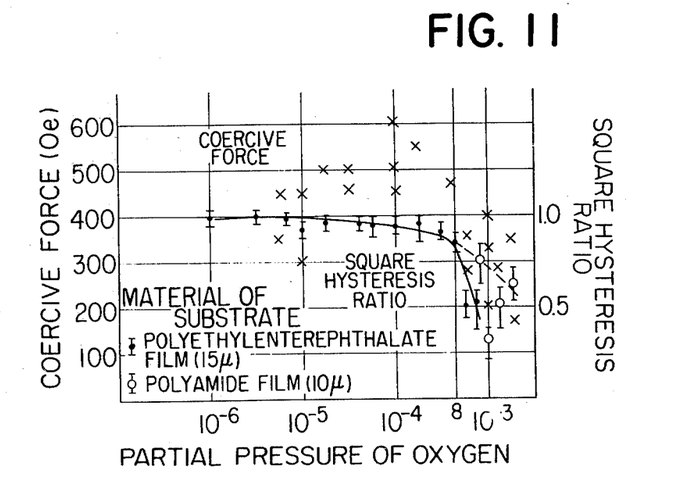
FIG. 11 shows the relationship between the coercive force and the partial pressure of oxygen when the magnetic tapes are fabricated with the apparatus shown in FIG. 10.

It is certified that error appears in the above—identified patent and that said Letters Patent is hereby corrected as shown below:

In the drawings delete Figures 9 and 11 and substitute the attached Figures therefore.

In the Abstract, line 2: Change "can" to --drum--.

In Column 1, line 18: Change "mined" to --mixed--.

line 21: Change "evaporation" to --sputtering--.

line 31: Change "inclined" to --oblique--.

line 38: Change "of" to --for--.

line 41: Change "deterioration" to --damage--.

In Column 2, line 29: Delete "Oe"

line 51: Change "Ball" to --Bell--.

line 54: Change "make-up" to --wind-up--.

In Column 4, line 34: Delete "Oe".

In Column 5, in TABLE 1, under column entitled "Introduction of oxygen": Change "$NO_3$" (all 5 occurrences) to --$O_2$--.

line 53: After "rotary" insert --drum--.

UNITED STATES PATENT AND TRADEMARK OFFICE
CERTIFICATE OF CORRECTION

PATENT NO. : 4,220,117

DATED : September 2, 1980

INVENTOR(S) : Koichi Shinohara

It is certified that error appears in the above—identified patent and that said Letters Patent is hereby corrected as shown below:

In Column 6, lines 64-65: Change "stabilised" to --stabilized--.

In Column 7, line 31: Change "can" (both occurrences) to --drum--.

In Column 8, lines 8 and 11: Change "cans" to --drums--.

lines 21 and 22: Change "can" to --drum--.

line 31: Change "gs" to --gas--.

In Column 10, line 53: Change "can" to --drum--.

In Column 11, line 35, and Column 12, line 26: Change "can" to --drum--.

FIG. 9

FIG. 11

Signed and Sealed this

Eleventh Day of August 1981

[SEAL]

Attest:

Attesting Officer

GERALD J. MOSSINGHOFF

Commissioner of Patents and Trademarks